(12) United States Patent
Yoo et al.

(10) Patent No.: US 8,828,766 B2
(45) Date of Patent: Sep. 9, 2014

(54) LIGHT-EMITTING DEVICE AND METHOD OF FABRICATING THE SAME

(75) Inventors: YoungZo Yoo, ChungCheongNam-Do (KR); SeoHyun Kim, ChungCheongNam-Do (KR); JeongWoo Park, ChungCheongNam-Do (KR); Taejung Park, ChungCheongNam-Do (KR); Gun Sang Yoon, ChungCheongNam-Do (KR)

(73) Assignee: Samsung Corning Precision Materials Co., Ltd. (KR)

( * ) Notice: Subject to any disclaimer, the term of this patent is extended or adjusted under 35 U.S.C. 154(b) by 82 days.

(21) Appl. No.: 13/448,629

(22) Filed: Apr. 17, 2012

(65) Prior Publication Data

US 2012/0261679 A1    Oct. 18, 2012

(30) Foreign Application Priority Data

Apr. 18, 2011    (KR) .......................... 10-2011-0035794

(51) Int. Cl.
*H01L 21/00* (2006.01)
*H01L 33/00* (2010.01)
*H01L 33/34* (2010.01)

(52) U.S. Cl.
CPC .......... *H01L 33/0087* (2013.01); *H01L 33/343* (2013.01)
USPC .................... 438/45; 257/E21.352

(58) Field of Classification Search
CPC ........................ H01L 33/0083; H01L 33/0087
USPC ........................ 438/37, 45, 603; 257/E21.352
See application file for complete search history.

(56) References Cited

U.S. PATENT DOCUMENTS 6,939,731 B2 *   9/2005   Ishizaki .......................... 438/22
8,546,797 B2 *   10/2013   Yamamuro et al. ............. 257/43

FOREIGN PATENT DOCUMENTS

KR        20020077557 A      10/2002

OTHER PUBLICATIONS

Choi, English translation of KR1020020077557 (published Oct. 12, 2002).*

* cited by examiner

*Primary Examiner* — Chandra Chaudhari
(74) *Attorney, Agent, or Firm* — Lerner, David, Littenberg, Krumholz & Mentlik, LLP

(57) ABSTRACT

A light-emitting device and a method of fabricating the same, in which the light emission characteristics of the light-emitting device in the UV range are maximized such that a high-efficiency light-emitting device can be produced at low cost. For this, the method includes the step of forming a zinc oxide light-emitting layer on a base substrate, the zinc oxide light-emitting layer including zinc oxide doped with a dopant; and activating the dopant by rapidly heat-treating the zinc oxide light-emitting layer, so that light emission in an ultraviolet range is increased.

9 Claims, 6 Drawing Sheets

LIGHT-EMITTING DEVICE AND METHOD OF FABRICATING THE SAME

CROSS REFERENCE TO RELATED APPLICATION

The present application claims priority from Korean Patent Application Number 10-2011-0035794 filed on Apr. 18, 2011, the entire contents of which application are incorporated herein for all purposes by this reference.

BACKGROUND OF THE INVENTION

1. Field of the Invention

The present invention relates to a light-emitting device and a method of fabricating the same, and more particularly, to a light-emitting device and a method of fabricating the same, in which the light emission characteristics of the light-emitting device in the ultraviolet (UV) range are maximized such that a high-efficiency light-emitting device can be produced at low cost.

2. Description of Related Art

Recently, light-emitting diodes (LEDs) have rapidly developed, to the extent that they are used in a variety of real-life applications. The usage of LEDs as a light source in displays or lighting systems continues to increase. Particularly, in LEDs that form a variety of light sources, an ultraviolet (UV) LED that emits light in the UV range is gaining interest as an important product in the lighting market.

However, gallium nitride (GaN), which is used as a semiconductor material for the UV LED, has a drawback in that its intensity is weak in the UV range. In order to compensate for this, GaN is used in the form of being alloyed with aluminum (Al).

In the meantime, some properties of zinc oxide (ZnO), such as a band gap and a crystal structure, are very similar to those of GaN. Therefore, ZnO is being actively studied as an inexpensive high-quality LED material that can replace GaN. In addition, unlike GaN, which is grown only on an expensive sapphire substrate, ZnO can be grown not only on a sapphire substrate but also on a glass substrate. Accordingly, the use of ZnO as an LED material can ensure price competitiveness.

Although the intensity of photoluminescence (PL) of ZnO is stronger than that of GaN in the UV range, this intensity is still not sufficient for actual application. Furthermore, when ZnO is grown on the glass substrate, its crystallinity is decreased, so its PL intensity in the UV range is necessarily decreased further.

Therefore, the development of a technology that can increase the PL intensity of ZnO in the UV range is urgently required so that ZnO can be used for the UV LED as a replacement to GaN.

The information disclosed in this Background of the Invention section is only for the enhancement of understanding of the background of the invention, and should not be taken as an acknowledgment or any form of suggestion that this information forms a prior art that would already be known to a person skilled in the art.

BRIEF SUMMARY OF THE INVENTION

Various aspects of the present invention provide a light-emitting device and a method of fabricating the same, in which the light emission characteristics of the light-emitting device in the ultraviolet (UV) range are maximized such that a high-efficiency light-emitting device can be produced at low cost.

In an aspect of the present invention, provided is a method of fabricating a light-emitting device. The method includes the steps of: forming a zinc oxide (ZnO) light-emitting layer on a base substrate, the ZnO light-emitting layer including ZnO doped with a dopant; and activating the dopant by rapidly heat-treating the ZnO light-emitting layer, so that light emission in the UV range is increased.

In an exemplary embodiment, the base substrate may be made of glass or sapphire.

In an exemplary embodiment, the ZnO light-emitting layer may be formed using one selected from the group consisting of pulse laser deposition, sputtering, spray coating, chemical vapor deposition (CVD) coating, evaporation and molecular beam epitaxy.

In an exemplary embodiment, the dopant may be one or a combination of at least two selected from the group consisting of gallium (Ga), aluminum (Al), silicon (Si), boron (B) and fluorine (F).

In an exemplary embodiment, the dopant may be Ga or F. Here, the dopant may be added in an amount of 4~7 wt %.

In an exemplary embodiment, the step of rapidly heat-treating the ZnO light-emitting layer may be carried out via rapid thermal annealing (RTA).

In addition, the step of rapidly heat-treating the ZnO light-emitting layer may be carried out in a nitrogen atmosphere.

Furthermore, the step of rapidly heat-treating the ZnO light-emitting layer may be carried out at a temperature ranging from 200° C. to 500° C. for 1 to 5 minutes.

In another aspect of the present invention, provided is a light-emitting device. The light-emitting device includes a base substrate and a zinc oxide (ZnO) light-emitting layer on the base substrate, the ZnO light-emitting layer including ZnO doped with a dopant. The dopant may be Ga or F, may be added as ion in an amount of 4~7 wt %, and may be activated via rapid heat treatment, so that light emission in the UV range is increased.

In an exemplary embodiment, a first cladding layer may be formed between the base substrate and the ZnO light-emitting layer, and a second cladding layer may be formed on the ZnO light-emitting layer.

The first cladding layer may be composed of ZnO doped with an n-dopant, and the second cladding layer may be composed of ZnO doped with a p-dopant.

The light-emitting device may be an ultraviolet (UV) light-emitting diode.

According to embodiments of the invention, the ZnO light-emitting layer, which is composed of ZnO doped with the dopant, is rapidly heat-treated, so that the light-emitting characteristics in the UV range can be maximized.

According to embodiments of the invention, the light-emitting layer having the maximized light-emitting characteristics can be applied to a light-emitting device, thereby realizing an inexpensive high-efficiency light-emitting device.

The methods and apparatuses of the present invention have other features and advantages which will be apparent from, or are set forth in greater detail in the accompanying drawings, which are incorporated herein, and in the following Detailed Description of the Invention, which together serve to explain certain principles of the present invention.

DETAILED DESCRIPTION OF THE INVENTION

Figure 1:
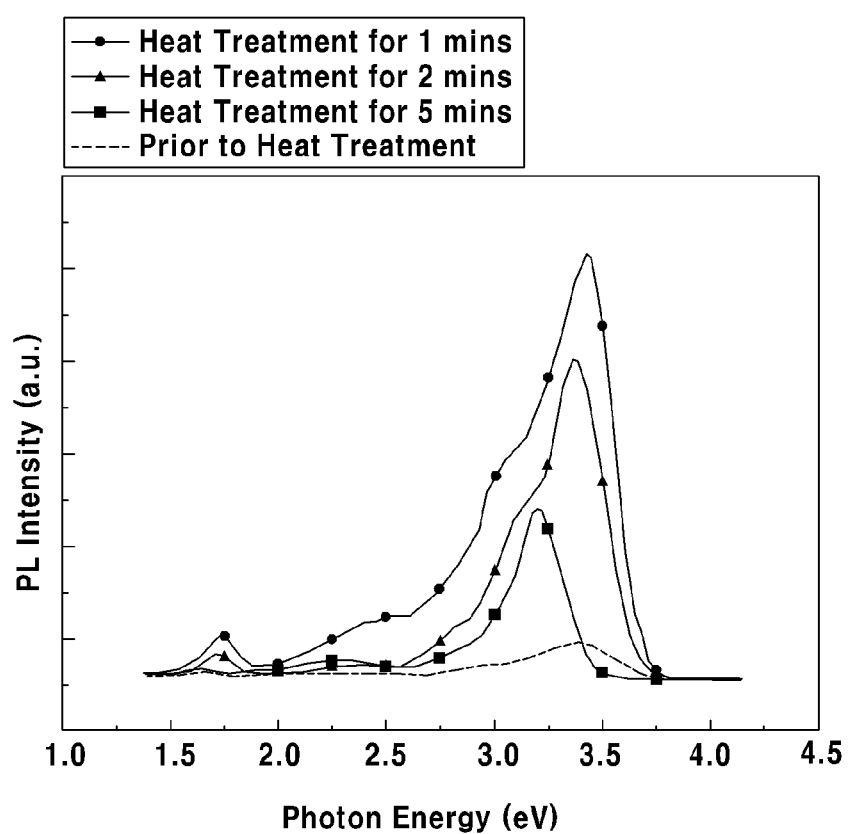
FIG. 1 to FIG. 3 are graphs depicting profiles of the intensity of photoluminescence (PL) of a light-emitting device, which is fabricated according to an embodiment of the invention, the profiles varying depending on heat treatment conditions, which are specific to doping concentration.

Hereinafter, a light-emitting device and a method of fabricating the same according to the invention will be described more fully with reference to the accompanying drawings, in which exemplary embodiments thereof are shown.

In the following description of the present invention, detailed descriptions of known functions and components incorporated herein will be omitted when they may make the subject matter of the present invention unclear.

The method of manufacturing a light-emitting device according to an exemplary embodiment of the invention includes the step of forming a zinc oxide (ZnO) light-emitting layer and the step of activating a dopant.

First, the step of forming the ZnO light-emitting layer is the step of forming the ZnO light-emitting layer, which and is composed of ZnO doped with the dopant, on a base substrate. The base substrate may be one selected from a glass substrate and a sapphire substrate. The glass substrate can be used as the base substrate in order to ensure price competitiveness. Here, any glass substrates can be used, as long as they have excellent light transmittance and excellent mechanical properties. For example, the glass substrate can be made of chemically tempered glass, such as sodalime ($SiO_2$—CaO—$Na_2O$) glass or aluminosilicate ($SiO_2$—$Al_2O_3$—$Na_2O$) glass.

In the step of forming the ZnO light-emitting layer, the ZnO light-emitting layer may be formed on the base substrate using one process selected from among, but not limited to, pulse laser deposition, sputtering, spray coating, chemical vapor deposition (CVD) coating, evaporation, and molecular beam epitaxy.

Here, the ZnO light-emitting layer includes the dopant. Specifically, the dopant may be formed into the ZnO before the ZnO light-emitting layer is formed, and may then be added along with the ZnO into the base substrate. Alternatively, the dopant may be added into the ZnO light-emitting layer, for example, via ion implantation. When the dopant is added, it exists as ion in the ZnO light-emitting layer. The ionized dopant then forms a shallow donor level in the ZnO light-emitting layer. When the shallow donor level is activated, it increases the intensity of photoluminescence (PL) in the UV range. This action will be described in greater detail later.

The dopant may be one or a combination of at least two selected from among, but not limited to, gallium (Ga), aluminum (Al), silicon (Si), boron (B) and fluorine (F). Since the step of activating the dopant is carried out using rapid heat treatment after this step, Ga or F, which has high thermal stability, may be selected.

In addition, the electrical conductivity of the ZnO light-emitting layer varies depending on the concentration of the dopant that is added. That is, the concentration of the dopant acts as an important factor that decides not only the shallow donor level but also the electrical conductivity. Considering the above matters, it is preferable that the dopant be added in an amount of 4~7 wt %.

Afterwards, in the step of activating the dopant, the dopant is activated by rapidly heat-treating the ZnO light-emitting layer, which is formed on the base substrate in the step of forming the ZnO light-emitting layer. The activation of the dopant in this way may increase light emission in the UV range of the shallow donor level.

Here, the rapid heat treatment may be carried out via rapid thermal annealing (RTA). The RTA is a type of heat treatment that can be used to conduct heat treatment on a sample in a short time period, thereby preventing components other than the sample, such as the base substrate, from being damaged. Thus, the RTA conducts heat treatment on the sample at a rapid heating rate for a short time period. This RTA can use a halogen lamp or an infrared (IR) lamp as a heat source. It is preferred that the RTA type rapid heat treatment be carried out at a temperature ranging from 200° C. to 500° C. for 1 to 5 minutes. In addition, it is preferred that the RTA type rapid heat treatment be carried out in a stable nitrogen atmosphere.

The light-emitting device, which is fabricated through the above-described process, includes the base substrate and the ZnO light-emitting layer. Here, the ZnO light-emitting layer is formed on the base substrate, and includes the dopant. The dopant is one selected from among Ga and F, is added in an amount of 4~7 wt %, and exists in the state in which it is activated via the rapid heat treatment. The dopant then acts to increase light emission in the UV range when the substrate is applied to a light-emitting device such as a light-emitting diode (LED). The resultant light-emitting device can then be used to make an inexpensive high-efficiency light-emitting device.

Example

Manufacture of Light-Emitting Layer and Evaluation of its Characteristics

Ga-doped ZnO light-emitting layers were formed on a respective glass substrate. Here, the three ZnO light-emitting layers that were formed had different doping concentrations of Ga, namely 4 wt %, 5 wt %, and 7 wt % of the amount of ZnO, in order to determine the optimum doping concentration.

Afterwards, the respective ZnO light-emitting layers were subjected to rapid heat treatment, thereby activating the ionized Ga. The rapid heat treatment was carried out in the form of rapid thermal annealing (RTA), and was carried out for 1, 2, and 5 minutes, respectively, on the respective ZnO light-emitting layers in order to determine the optimum rapid heat treatment conditions.

Variations in properties depending on the concentration and rapid heat treatment time of Ga are presented in FIG. 1 to FIG. 5.

Figure 2:
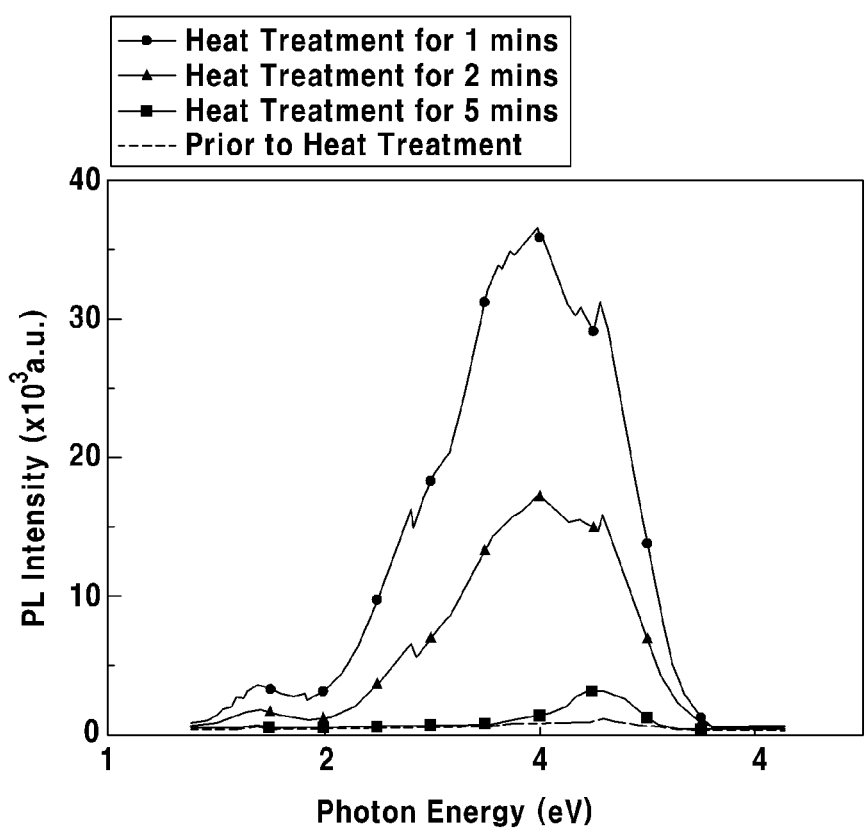
Figure 3:
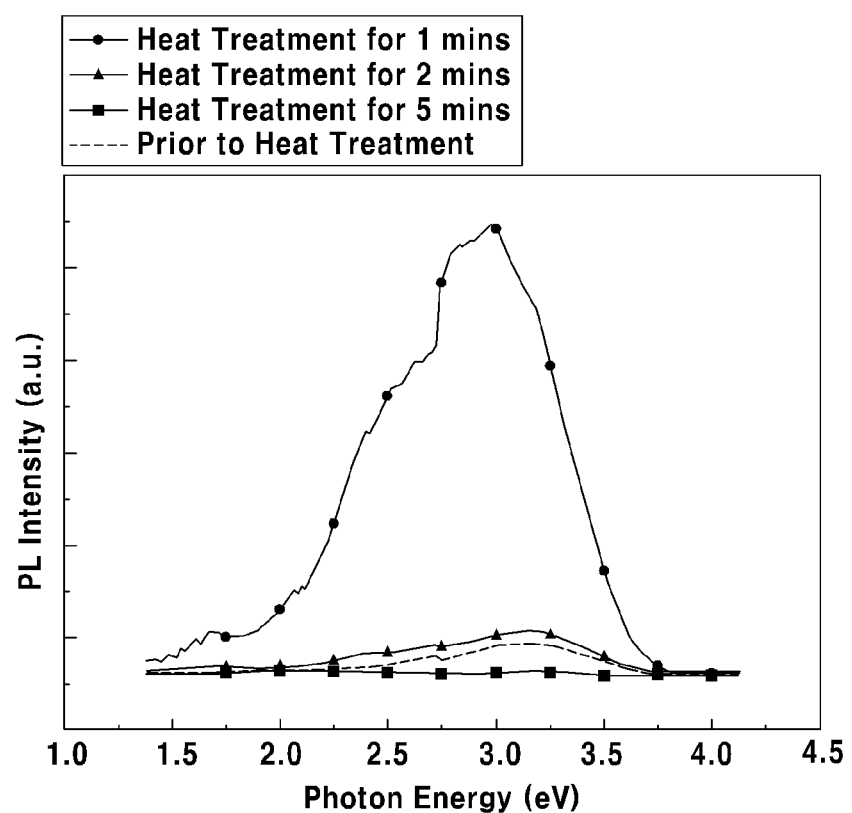

In these figures, FIG. 1 is a graph that depicts variations in PL intensity after the ZnO light-emitting layer including 4 wt % of Ga was heat-treated for 1, 2, and 5 minutes, FIG. 2 is a graph that depicts variations in PL intensity after the ZnO light-emitting layer including 5 wt % of Ga was heat-treated for 1, 2, and 5 minutes, and FIG. 3 is a graph that depicts variations in PL intensity after the ZnO light-emitting layer including with 7 wt % of Ga was heat-treated for 1, 2, and 5 minutes.

As shown in FIG. 1 to FIG. 3, it was observed that the PL intensity in the UV range of 4.0 eV or less was maximized when the ZnO light-emitting layer was rapidly heat-treated for 1 minute. It was also observed that the PL intensity decreased when the heat treatment continued for 2 minutes or longer. In addition, an increase in the PL intensity at about 1.7 eV was observed after the heat treatment, compared to before the heat treatment.

Figure 4:
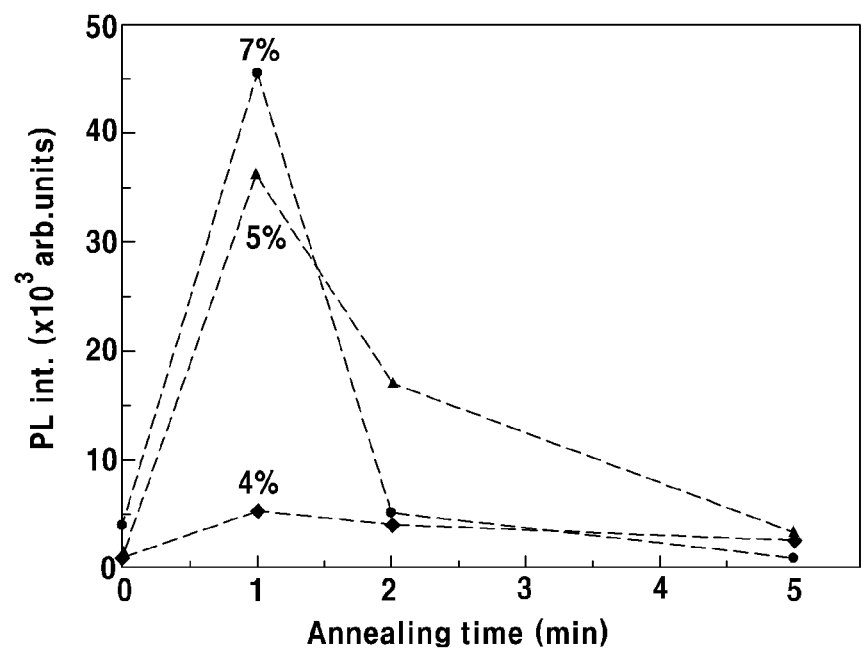
FIG. 4 is a graph quantitatively depicting profiles of the PL intensity of a light-emitting device, which is fabricated according to an embodiment of the invention, the profiles varying depending on the doping concentration.
Figure 5:
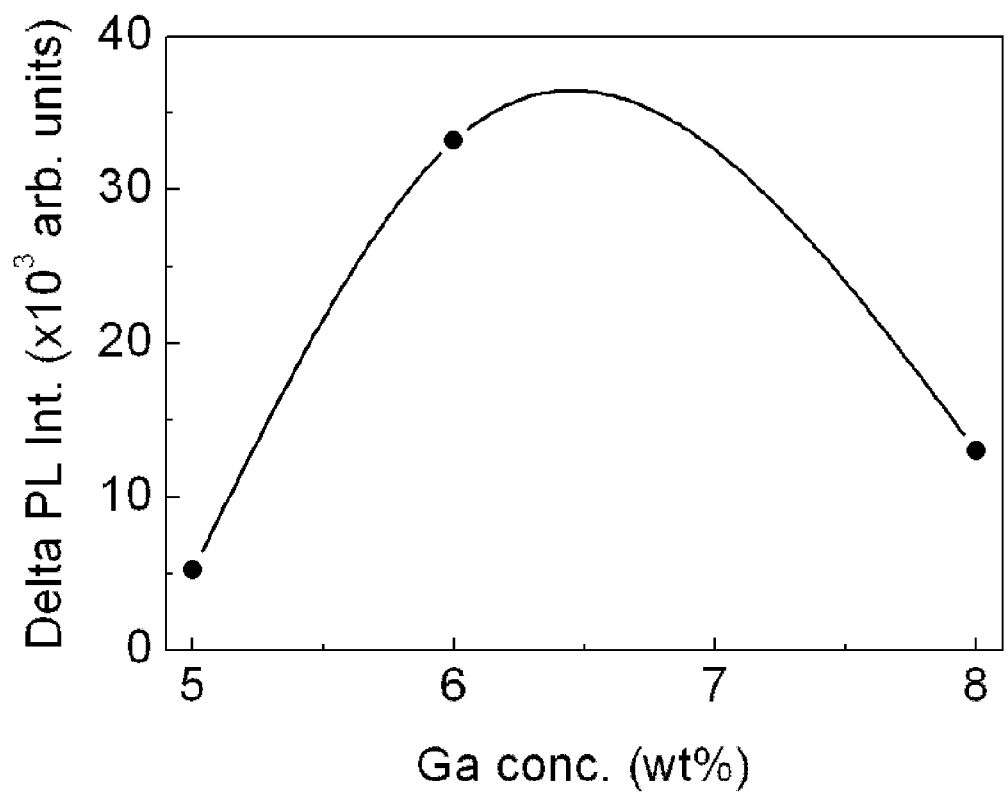
FIG. 5 is a graph depicting the dependency between the doping concentration and the PL intensity of a light-emitting device, which is fabricated according to an embodiment of the invention, when the substrate is heat-treated for 1 minute.

FIG. 4 is a graph quantitatively depicting the PL intensity depending on the concentration of Ga that was added. In FIG. 4, the quantification was based on the PL intensity of the respective concentration at 3.0 eV. FIG. 5 is a graph depicting the dependency between the concentration of Ga that was added and the PL intensity upon heat treatment for 1 minute.

As shown in FIG. 4 and FIG. 5, observed was a tendency in which the PL intensity was maximized when Ga was added at a concentration of 7 wt %. The PL intensity at the concentration of 7 wt % appeared to be almost 40 times as great as the PL intensity when Ga was added at a concentration of 4 wt %. That is, it was observed that the doping of the ZnO light-emitting layer with 7 wt % of Ga was able to increase the PL intensity such that it becomes at least 40 times as great as that of the ZnO light-emitting layer before being doped. In addition, the PL intensity increased when the doping was carried out at a Ga concentration of 4 wt % or more. Since there was a great variation in the PL intensity at a Ga concentration between 4 wt % and 5 wt %, it appeared to be preferable to carry out the doping at a Ga concentration of 5 wt % or more when considering efficiency. Referring to FIG. 5, variation in the PL intensity rapidly increased at a Ga concentration ranging from 5 wt % to 6 wt %, was maximized at a Ga concentration ranging from 6 wt % to 7 wt %, and sharply decreased at a Ga concentration of 7 wt % or more. Therefore, Ga added into the ZnO light-emitting layer during doping can maximize light emission in the UV range when added at a concentration ranging from 6 wt % to 7 wt %.

In brief, the PL intensity in the UV range is determined by the crystallinity and the stoichiometry of a thin film, i.e. the ZnO light-emitting layer. In the Example of the invention, since the ZnO was grown on the glass substrate and doped with Ga, the crystallinity and the stoichiometry of the ZnO light-emitting layer would be degraded. Nevertheless, in the Example of the invention, it was possible to fabricate the light-emitting device that exhibits the maximum PL intensity in the UV range by doping the ZnO light-emitting layer with 6 wt % to 7 wt % of Ga and then rapidly heat-treating the resultant Ga-doped ZnO light-emitting layer.

Figure 6:
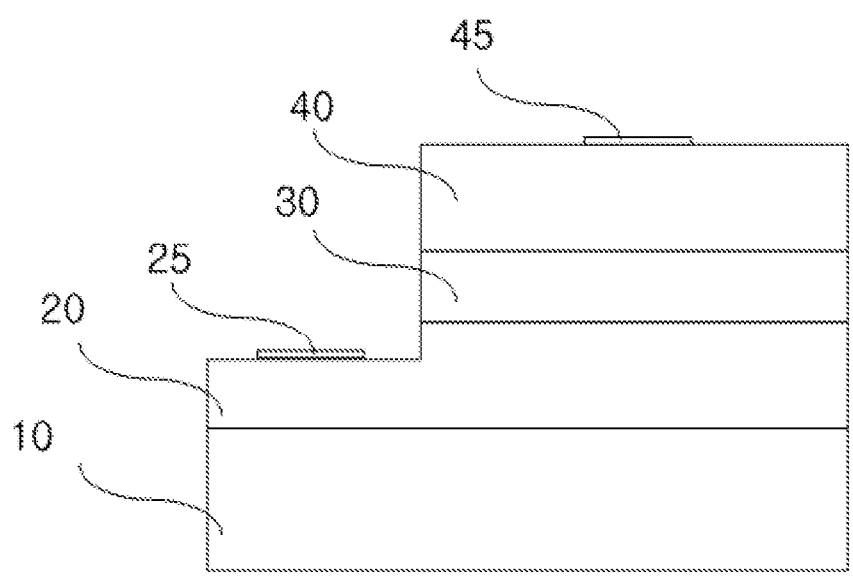
FIG. 6 is a cross-sectional view depicting a light-emitting device according to an exemplary embodiment of the invention.

FIG. 6 is a cross-sectional view depicting a light-emitting device according to an exemplary embodiment of the invention.

FIG. 6 shows a UV LED, which includes a base substrate 10, a first cladding layer 20, a first electrode 25, a light-emitting layer 30, a second cladding layer 40 and a second electrode 45.

The first cladding layer may be composed of ZnO, which is doped with an n-dopant. Here, the n-dopant may be Ga, Al, or the like. The light-emitting layer may be composed of Ga-doped ZnO. The light-emitting layer exhibits excellent UV-emitting characteristics because the Ga dopant is activated due to rapid heat treatment. The second cladding layer may be composed of ZnO, which is doped with a p-dopant. The p-dopant may be phosphorous (P), nitrogen (N), arsenic (As), or the like.

FIG. 6 shows only an exemplary embodiment of the invention, but it should be understood that the invention is not limited to the structure of FIG. 6.

The foregoing descriptions of specific exemplary embodiments of the present invention have been presented with respect to the certain embodiments and drawings. They are not intended to be exhaustive or to limit the invention to the precise forms disclosed, and obviously many modifications and variations are possible for a person having ordinary skill in the art in light of the above teachings.

It is intended therefore that the scope of the invention not be limited to the foregoing embodiments, but be defined by the Claims appended hereto and their equivalents.

What is claimed is:

1. A method of fabricating a light-emitting device, comprising:
   forming a zinc oxide light-emitting layer on a base substrate, the zinc oxide light-emitting layer comprising zinc oxide doped with a dopant; and
   activating the dopant by rapidly heat-treating the zinc oxide light-emitting layer to increase light emission in an ultraviolet range;
   wherein the dopant is added in an amount of 4~7 wt %;
   wherein the rapidly heat-treating comprises rapid thermal annealing;
   wherein the rapidly heat-treating is carried out at a temperature ranging from 200° C. to 500° C. for 1 to 5 minutes.

2. The method of claim 1, wherein the base substrate comprises glass or sapphire.

3. The method of claim 1, wherein the zinc oxide light-emitting layer is formed using one selected from the group consisting of pulse laser deposition, sputtering, spray coating, chemical vapor deposition coating, evaporation and molecular beam epitaxy.

4. The method of claim 1, wherein the dopant comprises at least one selected from the group consisting of gallium, aluminum, silicon, boron and fluorine.

5. The method of claim 1, wherein the dopant is gallium or fluorine.

6. The method of claim 1, wherein the rapidly heat-treating is carried out in a nitrogen atmosphere.

7. The method of claim 1, wherein the light-emitting device comprises:
   a first cladding layer formed between the base substrate and the zinc oxide light-emitting layer; and
   a second cladding layer formed on the zinc oxide light-emitting layer.

8. The method of claim 7, wherein the first cladding layer comprises zinc oxide doped with an n-dopant, and the second cladding layer comprises zinc oxide doped with a p-dopant.

9. The method of claim 8, wherein the light-emitting device comprises an ultraviolet light-emitting diode.

* * * * *